United States Patent
Oh et al.

(12)

(10) Patent No.: US 10,170,704 B2
(45) Date of Patent: Jan. 1, 2019

(54) ORGANIC ELECTROLUMINESCENT DEVICE AND DISPLAY INCLUDING THE SAME

(71) Applicant: SAMSUNG DISPLAY CO., LTD., Yongin-si, Gyeonggi-do (KR)

(72) Inventors: Eonseok Oh, Yongin-si (KR); Sangyeol Kim, Hwaseong-si (KR); Jungyeon Kim, Suwon-si (KR); Minkyoung Jo, Seoul (KR); Bomi Choi, Seoul (KR)

(73) Assignee: SAMSUNG DISPLAY CO., LTD., Yongin-si, Gyeonggi-do (KR)

( * ) Notice: Subject to any disclaimer, the term of this patent is extended or adjusted under 35 U.S.C. 154(b) by 82 days.

(21) Appl. No.: 15/147,374

(22) Filed: May 5, 2016

(65) Prior Publication Data
US 2017/0117480 A1 Apr. 27, 2017

(30) Foreign Application Priority Data

Oct. 27, 2015 (KR) .......................... 10-2015-0149603

(51) Int. Cl.
*H01L 51/00* (2006.01)
*H01L 51/50* (2006.01)
*H01L 51/52* (2006.01)

(52) U.S. Cl.
CPC ...... *H01L 51/0058* (2013.01); *H01L 51/0067* (2013.01); *H01L 51/0081* (2013.01); *H01L 51/5004* (2013.01); *H01L 51/508* (2013.01); *H01L 51/5076* (2013.01); *H01L 51/5028* (2013.01); *H01L 51/5056* (2013.01); *H01L 51/5088* (2013.01); *H01L 51/5092* (2013.01); *H01L 51/5206* (2013.01); *H01L 51/5221* (2013.01); *H01L 2251/552* (2013.01); *H01L 2251/558* (2013.01)

(58) Field of Classification Search
CPC ............... H01L 51/0058; H01L 51/508; H01L 51/5076; H01L 51/5004; H01L 51/0081; H01L 51/0067; H01L 2251/552; H01L 51/5221; H01L 51/5206; H01L 51/5092; H01L 51/5088; H01L 51/5056; H01L 51/5028; H01L 2251/558

USPC .......................... 428/690, 411.1; 252/301.16
See application file for complete search history.

(56) References Cited

U.S. PATENT DOCUMENTS

| | | | | |
|---|---|---|---|---|
| 6,573,651 B2 * | 6/2003 | Adachi | ............... | H01L 51/5016 257/40 |
| 7,371,469 B2 * | 5/2008 | Oshiyama | ............... | C09K 11/06 313/504 |
| 7,504,163 B2 * | 3/2009 | Jarikov | .................. | C09K 11/06 313/504 |
| 7,595,118 B2 * | 9/2009 | Chun | ..................... | B82Y 10/00 313/504 |
| 8,040,044 B2 * | 10/2011 | Kang | .................. | H01L 51/5088 313/483 |
| 2017/0352707 A1 * | 12/2017 | Kim | ..................... | H01L 27/322 |
| 2018/0006106 A1 * | 1/2018 | Oh | ........................ | H01L 27/322 |
| 2018/0019434 A1 * | 1/2018 | Park | .................... | H01L 51/5228 |

FOREIGN PATENT DOCUMENTS

| | | |
|---|---|---|
| JP | 2006-332031 A | 12/2006 |
| KR | 10-2012-0078294 A | 7/2012 |
| KR | 10-2012-0078298 A | 7/2012 |
| KR | 10-2013-0007873 A | 1/2013 |
| KR | 10-2014-0030462 A | 3/2014 |

OTHER PUBLICATIONS

English translation of KR 10-2012-0078294, Jul. 10, 2012. (Year: 2012).*
Hany Aziz, Degradation Mechanism of Small Molecule-Based Organic Light-Emitting Devices, vol. 283 Science, Mar. 19, 1999.

* cited by examiner

*Primary Examiner* — Douglas J McGinty
(74) *Attorney, Agent, or Firm* — Lee & Morse, P.C.

(57) ABSTRACT

An organic electroluminescent device includes a first electrode, a hole transport region on the first electrode, an emission layer on the hole transport region, an electron transport region on the emission layer, and a second electrode on the electron transport region. The electron transport region includes a first electron transport layer on the emission layer; and a second electron transport layer on the first electron transport layer. An absolute value of difference between a highest occupied molecular orbital (HOMO) energy level of the emission layer and a HOMO energy level of the first electron transport layer is about 0.3 eV to about 1.5 eV.

19 Claims, 10 Drawing Sheets

ORGANIC ELECTROLUMINESCENT DEVICE AND DISPLAY INCLUDING THE SAME

CROSS-REFERENCE TO RELATED APPLICATION

Korean Patent Application No. 10-2015-0149603, filed on Oct. 27, 2015, in the Korean Intellectual Property Office, and entitled: "Organic Electroluminescent Device and Display Including the Same," is incorporated by reference herein in its entirety.

BACKGROUND

1. Field

Embodiments relate to an organic electroluminescent device and an organic display including the same.

2. Description of the Related Art

Flat displays are largely divided into an emissive type and non-emissive type. Examples of the emissive type include a flat cathode ray tube, a plasma display panel, and an organic electroluminescent display (organic light emitting display, OLED), etc. The OLED is a self-luminescent display having advantages of a broad viewing angle, good contrast, and rapid response rate.

Accordingly, the OLED may be applied to displays for mobile apparatus such as a distal camera, a video camera, a camcorder, a personal digital assistant, a smartphone, an ultrathin laptop, a tablet personal computer, or a flexible display, or to large electronic products or large electrical appliance such as an ultrathin television, thereby being spotlighted.

In the OLED, holes and electrons injected from first and second electrodes recombine and emit light in emission layers, thereby implementing color. The injected holes and electrons combine to form excitons which drop from the excited state to the ground state, thereby emitting light.

SUMMARY

Embodiments are directed to an organic electroluminescent device including a first electrode, a hole transport region on the first electrode, an emission layer on the hole transport region, an electron transport region on the emission layer, and a second electrode on the electron transport region. The electron transport region includes a first electron transport layer on the emission layer; and a second electron transport layer on the first electron transport layer. An absolute value of difference between a highest occupied molecular orbital (HOMO) energy level of the emission layer and a HOMO energy level of the first electron transport layer is about 0.3 eV to about 1.5 eV.

An absolute value of difference between a lowest unoccupied molecular orbital (LUMO) energy level of the emission layer and a LUMO energy level of the first electron transport layer may be about 0 eV to about 0.2 eV.

An absolute value of difference between the LUMO energy level of the first electron transport layer and a LUMO energy level of the second electron transport layer may be about 0 eV to about 0.2 eV.

The absolute value of difference between the HOMO energy level of the emission layer and the HOMO energy level of the first electron transport layer may be about 0.5 eV to about 1.5 eV.

The first electron transport layer may contact the emission layer. The second electron transport layer may contact the first electron transport layer.

The first electron transport layer may include a first electron transport material and a first n-type dopant. The second electron transport layer may include a second electron transport material and a second n-type dopant.

The first electron transport material and the second electron transport material may be the same as each other.

The first n-type dopant and the second n-type dopant may be the same as each other, and a weight percent (wt %) of the first n-type dopant based on a total weight of the first electron transport layer and a weight percent (wt %) of second n-type dopant based on a total weight of the second electron transport layer may be different from each other.

The wt % of the second n-type dopant based on the total weight of the second electron transport layer may be less than the wt % of the first n-type dopant based on the total weight of the first electron transport layer.

The first n-type dopant and the second n-type dopant may be different from each other.

The first electron transport material and the second electron transport material may each include at least one selected from the group of an anthracene derivative, a phosphine oxide derivative, a nitrogen-containing aromatic compound, and tris(8-hydroxyquinolinato)aluminum ($Alq_3$).

The first n-type dopant and the second n-type dopant may each include at least one selected from the group of lithium quinolate (Liq), LiF, $Li_2O$, CsF, BaF, BaO, $Al_2O_3$, NaCl, RbCl, RbI, Ca, Cs and Yb.

The emission layer may include an anthracene derivative represented by following Formula 1:

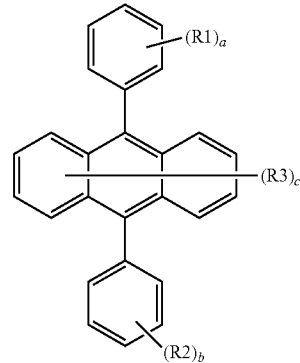

[Formula 1]

wherein, in Formula 1, R1 to R3 are each independently hydrogen, deuterium, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms, a and b are each an integer from 0 to 5, c is an integer from 0 to 8, and a plurality of adjacent R1 to R3 may combine with one another for forming a saturated or unsaturated ring.

In Formula 1, a may be 2, and two adjacent R1 may combine with each other and form a benzene ring.

The thickness of the first electron transport layer may be about 10 Å to about 150 Å.

The hole transport region may include a hole injection layer on the first electrode, and a hole transport layer on the hole injection layer. The electron transport region further may include an electron injection layer between the second electron transport layer and the second electrode.

Embodiments are also directed to an organic electroluminescent display including a plurality of pixels. Each pixel may include a first electrode, a hole transport region on the first electrode, an emission layer on the hole transport region, an electron transport region on the emission layer, and a second electrode on the electron transport region. The electron transport region includes a first electron transport layer on the emission layer and a second electron transport layer on the first electron transport layer. An absolute value of a difference between a highest occupied molecular orbital (HOMO) energy level of the emission layer and a HOMO energy level of the first electron transport layer is about 0.3 eV to about 1.5 eV.

An absolute value of a difference between a lowest unoccupied molecular orbital (LUMO) energy level of the emission layer and a LUMO energy level of the first electron transport layer may be about 0 eV to about 0.2 eV. An absolute value of a difference between the LUMO energy level of the first electron transport layer and a LUMO energy level of the second electron transport layer may be about 0 eV to about 0.2 eV.

The first electron transport layer may include a first electron transport material and a first n-type dopant. The second electron transport layer may include a second electron transport material and a second n-type dopant. The first electron transport material and the second electron transport material may be the same as each other. The first n-type dopant and the second n-type dopant may be the same as each other. The weight percent (wt %) of the second n-type dopant based on a total weight of the second electron transport layer may be lower than the weight percent (wt %) of the first n-type dopant based on a total weight of the first electron transport layer.

The first electron transport layer may include a first electron transport material and a first n-type dopant. The second electron transport layer may include a second electron transport material and a second n-type dopant. The first electron transport material and the second electron transport material may be the same as each other, and the first n-type dopant and the second n-type dopant may be different from each other.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
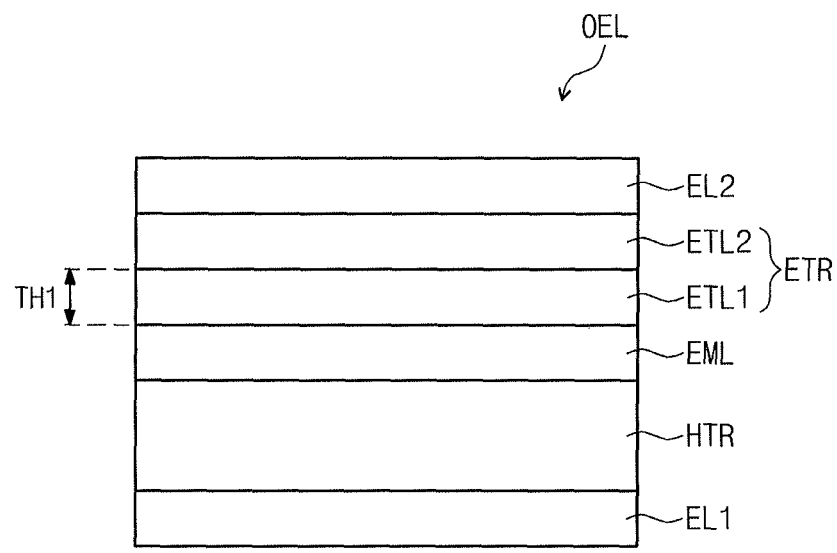
FIG. 1 illustrates a cross sectional view schematically showing an organic electroluminescent device according to an embodiment.
Figure 1:

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

Hereinafter, an organic electroluminescent device according to an embodiment will be described.

Figure 2:
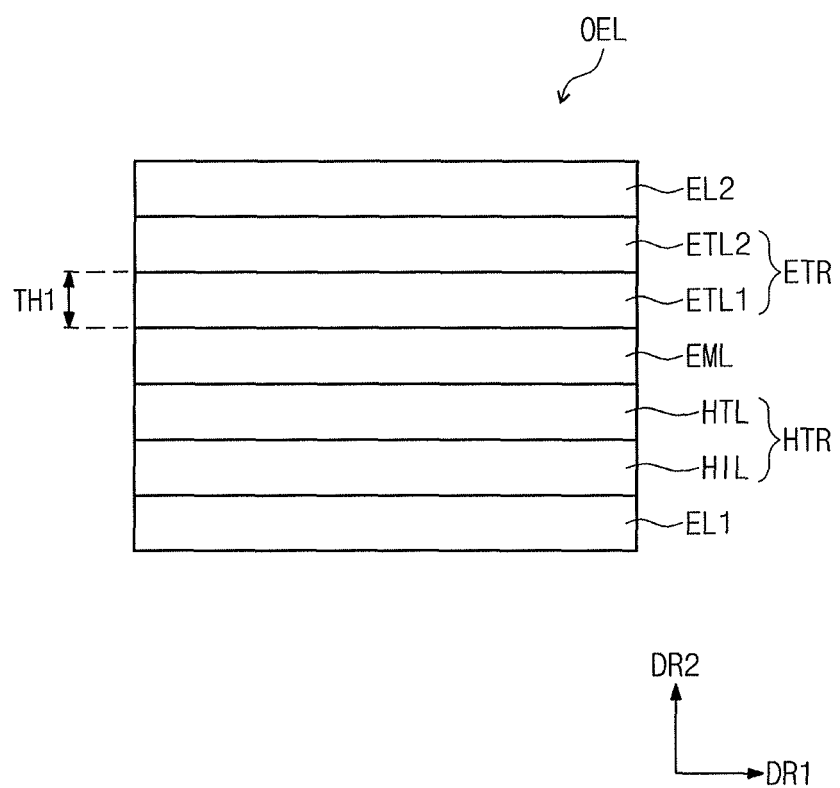
FIG. 2 illustrates a cross sectional view schematically showing an organic electroluminescent device according to an embodiment.
Figure 3:
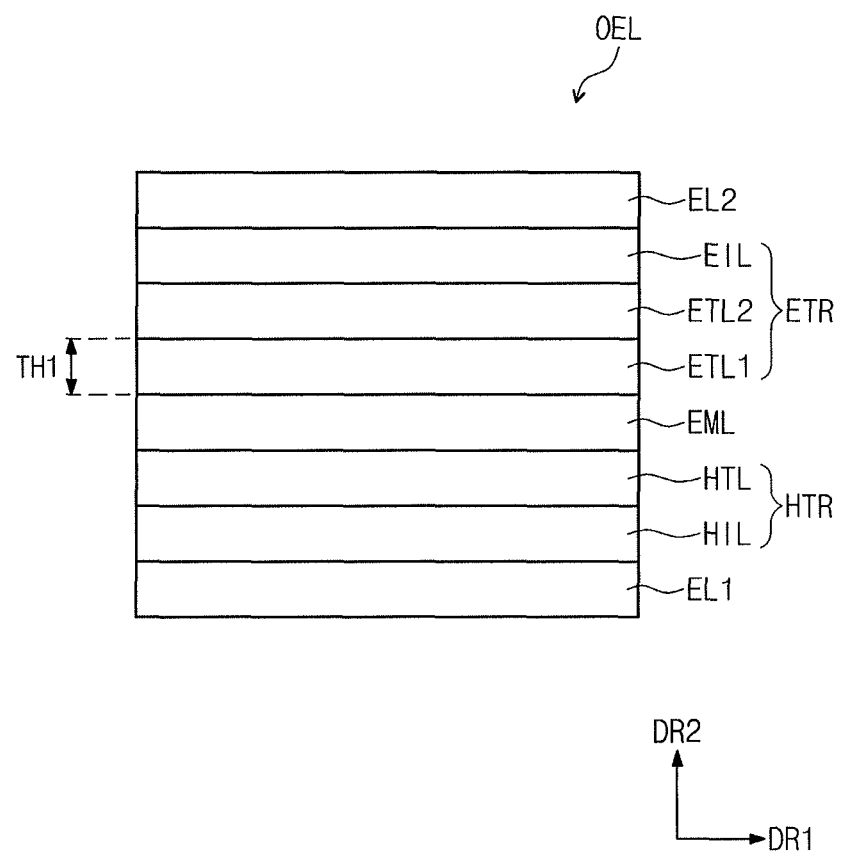
FIG. 3 illustrates a cross sectional view schematically showing an organic electroluminescent device according to an embodiment.

FIG. 1 illustrates a cross sectional view schematically showing an organic electroluminescent device according to an embodiment. FIG. 2 illustrates a cross sectional view schematically showing an organic electroluminescent device according to an embodiment. FIG. 3 illustrates a cross sectional view schematically showing an organic electroluminescent device according to an embodiment.

Referring to FIGS. 1 to 3, the organic electroluminescent device OEL according to an embodiment may include a first electrode EL1, a hole transport region HTR, an emission layer EML, an electron transport region ETR, and a second electrode EL2. The hole transport region HTR, the emission layer EML, the electron transport region ETR, and the second electrode EL2 may be sequentially provided on the first electrode EL1 in a certain direction (e.g., DR2).

The first electrode EL1 and the second electrode EL2 may be opposite to each other. The first electrode EL1 may have conductivity. The first electrode EL1 may be an anode. The first electrode EL1 may be a pixel electrode. The first electrode EL1 may be a transmissive electrode, a semi-transmissive electrode, or a reflective electrode. When the first electrode EL1 is a transmissive electrode, the first electrode EL1 may be formed using a transparent metal oxide, for example, indium tin oxide (ITO), indium zinc oxide (IZO), zinc oxide (ZnO), or indium tin zinc oxide (ITZO), etc. When the first electrode EL1 is a semi-transmissive electrode or a reflective electrode, the first electrode EL1 may include Ag, Mg, Al, Pt, Pd, Au, Ni, Nd, Ir, Cr, or a mixture of metals.

An organic layer may be disposed on the first electrode EL1. The organic layer may include the hole transport region HTR, the emission layer EML, and the electron transport region ETR.

The hole transport region HTR may be provided on the first electrode EL1. The hole transport region HTR may be provided between the first electrode EL1 and the emission layer EML. The hole transport region HTR may have a structure of a monolayer made with a single material, a monolayer made with a plurality of different materials, or a multilayer having a plurality of layers made with a plurality of different materials.

The hole transport region HTR may include at least one of a hole injection layer HIL, a hole transport layer HTL, a monolayer having a hole transport function and a hole injection function, a buffer layer, or an electron blocking layer. For example, referring to FIG. 2, the hole transport region HTR may include the hole injection layer HIL provided on the first electrode EL1, and the hole transport layer HTL provided on the hole injection layer HIL.

For example, the hole transport region HTR may have a monolayer structure formed by using a plurality of different materials or may have a structure in which, in order from the first electrode EL1, the hole injection layer HIL/hole transport layer HTL, the hole injection layer HIL/hole transport layer HTL/buffer layer, the hole injection layer HIL/buffer layer, the hole transport layer HTL/buffer layer or the hole injection layer HIL/hole transport layer HTL/electron blocking layer are sequentially laminated. In some implementations, the hole transport region HTR may include a monolayer that simultaneously performs a hole injection function and a hole transport function.

The hole transport region HTR may be formed by using a suitable method such as vacuum deposition, spin-coating, cast, Langmuir-Blodgett (LB) method, inkjet printing, laser printing, or laser induced thermal imaging (LITI).

When the hole transport region HTR includes the hole injection layer HIL, the hole transport region HTR may include a phthalocyanine compound such as copper phthalocyanine; N,N'-diphenyl-N,N'-bis-[4-(phenyl-m-tolyl-amino)-phenyl]-biphenyl-4,4'-diamine (DNTPD), 4,4',4''-tris(3-methylphenylphenylamino) triphenylamine (m-MTDATA), 4,4'4''-tris(N,N-diphenylamino)triphenylamine (TDATA), 4,4',4''-tris{N-(2-naphthyl)-N-phenylamino}-triphenylamine (2TNATA), poly(3,4-ethylenedioxy thiophene)/poly(4-styrenesulfonate) (PEDOT/PSS), polyaniline/dodecylbenzenesulfonic acid (PANI/DBSA), polyaniline/camphor sulfonic acid (PANI/CSA), or (polyaniline)/poly(4-styrenesulfonate) (PANI/PSS), etc., as examples.

When the hole transport region HTR includes the hole transport layer HTL, the hole transport region HTR may include a carbazole-based derivative such as N-phenyl carbazole or polyvinyl carbazole, a fluorene-based derivative, a triphenylamine-based derivative such as N,N'-bis(3-methylphenyl)-N,N'-diphenyl-[1,1-biphenyl]-4,4'-diamine (TPD), and 4,4',4''-tris(N-carbazolyl)triphenylamine (TCTA), N,N'-di(1-naphthyl)-N,N'-diphenylbenzidine (NPB), 4,4'-cyclohexylidene bis[N,N-bis(4-methylphenyl) benzenamine] (TAPC), etc., as examples.

The hole transport layer HTL may include a p-type dopant.

The thickness of the hole transport region HTR may be about 100 Å to about 1,000 Å, or, for example, about 100 Å to about 1,500 Å. When the hole transport region HTR includes both the hole injection layer HIL and the hole transport layer HTL, the thickness of the hole injection layer HIL may be about 100 Å to about 10,000 Å, or, for example, about 100 Å to about 1,500 Å, and the thickness of the hole transport layer HTL may be about 50 Å to about 2,000 Å, or, for example, about 100 Å to about 1,500 Å. When the thicknesses of the hole transport region HTR, the hole injection layer HIL, and the hole transport layer HTL fall within the above-described range, a desirable degree of the hole transport property may be obtained without a substantial increase in the driving voltage.

The emission layer EML may be provided on the hole transport region HTR. The emission layer EML may be provided on the hole transport layer HTL. The emission layer EML may include a monolayer structure formed by using a single material, a monolayer structure formed by using a plurality of different materials, or a multilayer structure having a plurality of layers formed by using a plurality of different materials.

When the emission layer EML is a monolayer, the emission layer EML may emit, for example, red light, green light, or blue light.

The emission layer EML may be formed by using a suitable such as vacuum deposition, spin-coating, cast, Langmuir-Blodgett (LB) method, inkjet printing, laser printing, or laser induced thermal imaging (LITI).

The emission layer EML may include a suitable material, for example, a material emitting red, green or blue light. The emission layer EML may include a fluorescent material or phosphorescent material. The emission layer EML may also include a host and dopant.

The host may be a suitable host material. For example, tris(8-hydroxyquinolinato)aluminum (Alq3), 4,4'-bis(N-carbazolyl)-1,1'-biphenyl (CBP), poly(n-vinylcarbazole) (PVK), 9,10-di(naphthalene-2-yl)anthracene (ADN), 4,4',4''-tris(carbazol-9-yl)-triphenylamine (TCTA), 1,3,5-tris(N-phenylbenzimidazole-2-yl)benzene (TPBi), 3-tert-butyl-9,10-di(naphth-2-yl)anthracene (TBADN), distyrylarylene (DSA), 4,4'-bis(9-carbazolyl)-2,2'-dimethyl-biphenyl (CDBP), and 2-methyl-9,10-bis(naphthalen-2-yl)anthracene (MADN), etc., may be used.

The emission layer EML may include an anthracene derivative represented by following Formula 1. For example, a host included in the emission layer EML may include the anthracene derivative represented by following Formula 1.

[Formula 1]

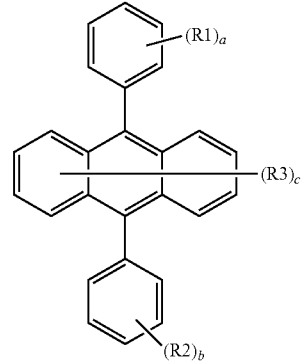

In Formula 1, R1 to R3 are each independently a hydrogen, a deuterium, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms, a and b are each independently an integer from 0 to 5, c is an integer from 0 to 8, and a plurality of adjacent R1 to R3 may be separate or may combine with one another to form a saturated or unsaturated ring.

When a is 2, two adjacent R1s may combine with each other to form a benzene ring fused with the benzene ring to which the two adjacent R1s are attached. In this case, the anthracene derivative represented by Formula 1 may be in a form of an anthracene structure substituted with a naphthyl group.

The anthracene derivative represented by Formula 1 may be, for example, one of following compounds.

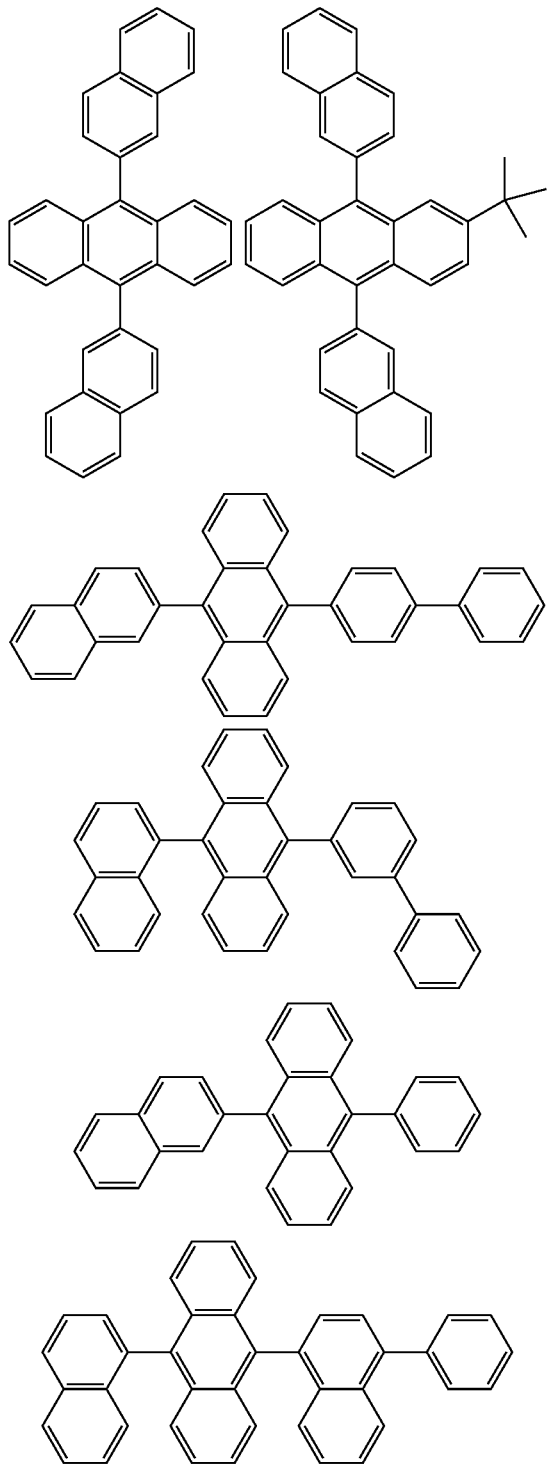

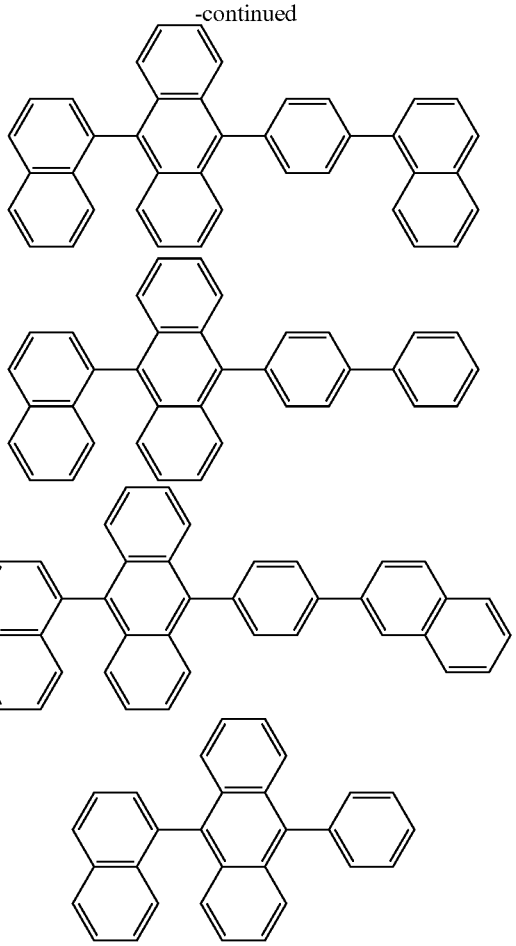

The term "substituted or unsubstituted" used herein refers to no substitution or substitution with one or more substituent selected from the group of deuterium, a halogen group, a nitryl group, a nitro group, an amino group, a phosphine oxide group, an alkoxy group, a silyl group, a boron group, an alkyl group, a cycloalkyl group, an alkenyl group, an aryl group, an alkyl amine group, a hetero aryl amine group, an aryl amine group, and a hetero-ring group. The term "substituted or unsubstituted may also refer to substitution with a substituent, in which two or more substituents among the above-exemplified substituents are linked. For example, a "substituent, in which two or more substituents are linked" may be a biphenyl group. The biphenyl group may be considered as an aryl group, and also as a substituent in which two phenyl groups are linked.

When a is 1 or more, a plurality of R1 may be the same as or different from one another. When b is 1 or more, a plurality of R2 may be the same as or different from one another. When c is 1 or more, a plurality of R3 may be the same as or different from one another.

When the emission layer EML emits red, the emission layer EML may include a fluorescent material including, for example PBD:Eu(DBM)$_3$(Phen) (tris(dibenzoylmethanato) phenanthoroline europium) or perylene. When the emission layer EML emits red, a dopant included in the emission layer EML may be selected from, for example, a metal complex such as (acac)(bis(1-phenylisoquinoline) acetylacetonate iridium (PIQIr), (acac)(bis(1-phenylquinoline)acetylacetonate iridium (PQIr), tris(1-phenylquinoline)iridium (PQIr), or octaethylporphyrin platinum (PtOEP) or an organometallic complex.

When the emission layer EML emits green, the emission layer EML may include a fluorescent material including, for example, tris(8-hydroxyquinolinato) aluminum (Alq3). When the emission layer EML emits green, a dopant included in the emission layer EML may be selected from, for example, a metal complex such as Ir(ppy)3 (fac-tris(2-phenylpyridine)iridium, or a organometallic complex.

When the emission layer EML emits blue, the emission layer EML may include a fluorescent material including, for example, any one selected from the group of spiro-DPVBi. Spiro-6P, distyryl-benzene (DSB), distyryl-arylene (DSA), a polyfluorene (PFO)-based polymer and a poly(p-phenylene vinylene (PPV)-based polymer. When the emission layer EML emits blue, a dopant included in the emission layer EML may be selected from, for example, a metal complex such as $(4,6-F2ppy)_2Irpic$ or an organometallic complex.

The electron transport region ETR may be provided on the emission layer EML. The electron transport region ETR may be formed by using a suitable method such as vacuum deposition, spin-coating, cast, Langmuir-Blodgett (LB) method, inkjet printing, laser printing, or laser induced thermal imaging (LITI).

The electron transport region ETR included in the organic electroluminescent device OEL according to an embodiment may include electron transport layers (ETL1, ETL2) in a bilayer structure. A first electron transport layer ETL1 and a second electron transport layer ETL2 may be sequentially laminated on the emission layer EML in a certain direction (e.g., DR2). The first electron transport layer ETL1 may be provided on the emission layer EML, and the second electron transport layer ETL2 may be provided on the first electron transport layer ETL1. By including the electron transport layers ETL1, ETL2 in a bilayer structure, electrons may be systemically injected into the emission layer EML.

The first electron transport layer ETL1 may be provided to be directly in contact with the emission layer EML such that a further layer is not be interposed between the emission layer EML and the first electron transport layer ETL1.

Figure 4:
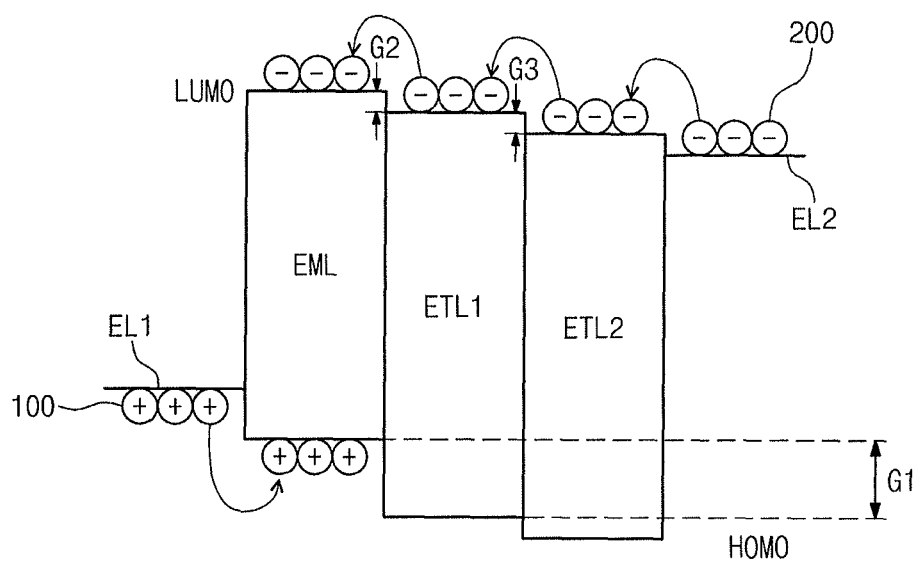
FIG. 4 schematically illustrates an energy transfer mechanism of the organic electroluminescent device according to an embodiment.
Figure 5:
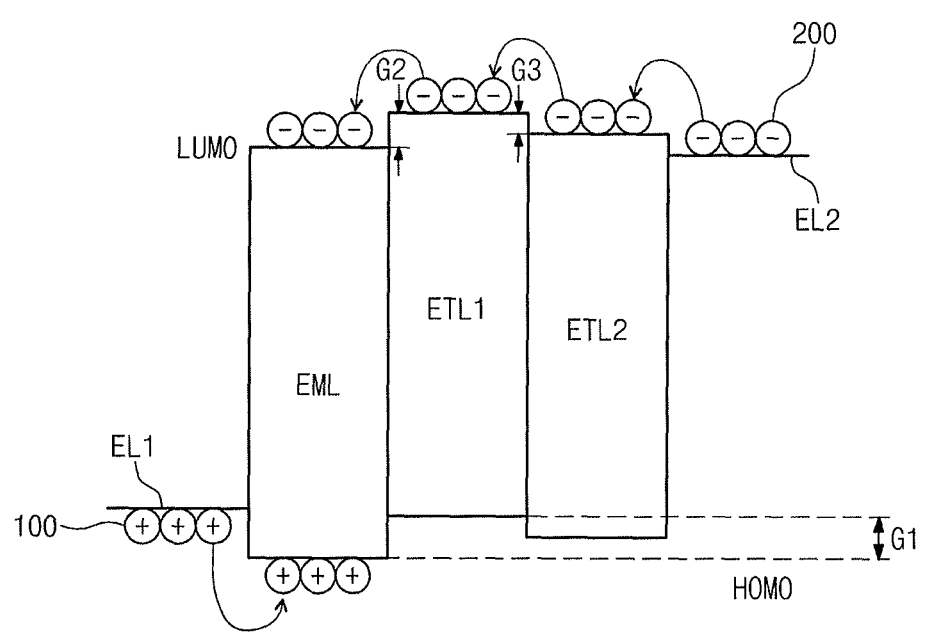
FIG. 5 schematically illustrates an energy transfer mechanism of the organic electroluminescent device according to an embodiment.
Figure 6:
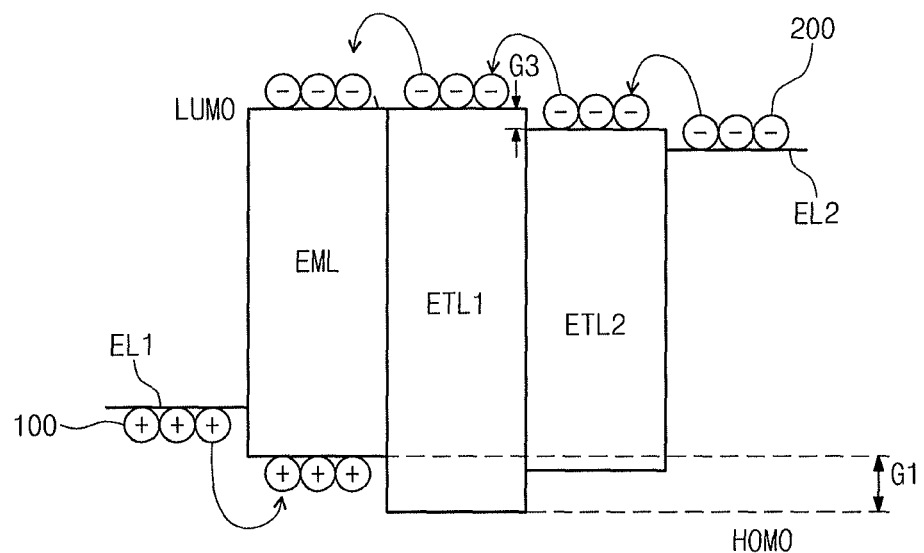
FIG. 6 schematically illustrates an energy transfer mechanism of the organic electroluminescent device according to an embodiment.

FIG. 4 schematically shows an energy transfer mechanism of the organic electroluminescent device according to an embodiment. FIG. 5 schematically shows an energy transfer mechanism of the organic electroluminescent device according to an embodiment. FIG. 6 schematically shows an energy transfer mechanism of the organic electroluminescent device according to an embodiment.

Referring to FIGS. 4 to 6, an absolute value of difference between a highest occupied molecular orbital (HOMO) energy level of the emission layer EML and a HOMO energy level of the first electron transport layer ETL1 may be about 0.3 eV to about 1.5 eV. For example, the absolute value of difference G1 between the HOMO energy level of the emission layer EML and the HOMO energy level of the first electron transport layer ETL1 may be about 0.5 eV to about 1.5 eV, about 0.3 eV to about 1.0 eV, about 0.3 eV to about 0.8 eV, about 0.5 eV to about 1.0 eV or about 0.5 eV to about 0.8 eV. When the absolute value of difference G1 between the HOMO energy level of the emission layer EML and the HOMO energy level of the first electron transport layer ETL1 is about 0.5 eV or more, the transport of holes 100 into the first electron transport layer ETL1 may be more effectively prevented.

Generally, the mobility of holes is greater than the mobility of electrons. Accordingly, among holes injected into the emission layer, remaining holes, for example, holes that do not combine with electrons and form excitons, may be injected into the electron transport layer. When such holes accumulate in the electron transport layer, the electron transport layer may become oxidized. The oxidation of the electron transport layer as such may cause a decline in the life of the organic electroluminescent device. The decline of life of the organic electroluminescent device due to the oxidation of the electron transport layer may proceed more rapidly than the decline of life of the organic electroluminescent device due to degradation of the emission layer. Thus, it is desirable to minimize the oxidation of the electron transport layer in order to enhance the life of the organic electroluminescent device.

In the organic electroluminescent device OEL according to an embodiment, the injection of holes 100 into the first electron transport layer ETL1 via the emission layer EML may be minimized by adjusting the absolute value of difference between the HOMO energy levels of the emission layer EML and the first electron transport layer ETL1. For example, the absolute value of difference G1 between the HOMO energy levels of the emission layer EML and the first electron transport layer ETL1 may be adjusted to about 0.3 eV or more, such that injection of holes 100 from the emission layer EML into the first electron transport layer ETL1 may be inhibited due to the energy barrier. When the absolute value of the difference G1 between HOMO energy levels of the emission layer EML and the first electron transport layers ETL1 is less than about 0.3 eV, an amount of leaked holes 100 that are injected into the first electron transport layer ETL1 from the emission layer EML may be increased, such that the effect of preventing injection of holes 100 into the first electron transport layer ETL1 may be insufficient. Further, in terms of convenience of manufacture, the absolute value of difference G1 between HOMO energy levels of the emission layer EML and the first electron transport layer ETL1 may be, for example about 1.5 eV or less.

As shown in FIGS. 4 to 6, the HOMO energy level of the emission layer EML may be greater than the HOMO energy level of the first electron transport layer ETL1. As shown in FIG. 5, the HOMO energy level of the emission layer EML may be lower than the HOMO energy level of the first electron transport layer ETL1. For example, if the absolute value of difference G1 between HOMO energy levels of the emission layer EML and the first electron transport layer ETL1 is about 0.3 eV or more, the HOMO energy level of the emission layer EML may be greater or lower than the HOMO energy level of the first electron transport layer ETL1.

The first electron transport layer ETL1 may simultaneously have an electron transport function and a hole blocking function.

An absolute value of difference G2 between a lowest unoccupied molecular orbital (LUMO) energy level of the emission layer and a LUMO energy level of the first electron transport layer ETL1 may be about 0 eV to about 0.2 eV.

In organic electroluminescent devices, adjustment of the driving voltage is easier when efficiency at each gray level is constant. In organic electroluminescent devices, efficiency is generally high at a low gray level (low brightness) region. Luminous bodies may become saturated in a high gray level (high brightness) region, and current efficiency may rapidly decrease. Efficiency may not be constant at each gray level. In an organic electroluminescent device implementing white color, for example, such limitation may lead to a change in the white color at each gray level.

In the organic electroluminescent device OEL according to an embodiment, the absolute difference between the LUMO energy levels of the emission layer EML and the first electron transport layer ETL1 may be adjusted, such that electrons 200 may be easily injected into the emission layer EML via the first electron transport layer ETL1. Generally, by lowering the energy barrier during the process of injection of the electrons 200 having lower mobility than the holes 100 into the emission layer EML, a rate at which the electrons 200 encounter the holes 100 in the emission layer EML may be increased, such that a problem of rapid decline in current efficiency from the low gray level to high gray level regions may be minimized. Consequently, a constant efficiency may be achieved at each gray level. For example, the effect may be achieved by adjusting the absolute difference between LUMO energy levels of the emission layer EML and the first electron transport layer ETL1 to be about 0.2 eV or less.

As shown in FIG. 4, the LUMO energy level of the emission layer EML may be higher than the LUMO energy level of the first electron transport layer ETL1. As shown in FIG. 5, the LUMO energy level of the emission layer EML may be lower than the LUMO energy level of the first electron transport layer ETL1. Accordingly, when the absolute value of difference G2 between LUMO energy levels of the emission layer EML and the first electron transport layer ETL1 is about 0.2 eV or less, the LUMO energy level of the emission layer may be higher or lower than the LUMO energy level of the first electron transport layer ETL1.

As shown in FIG. 6, the LUMO energy level of the emission layer EML may be the same as the LUMO energy level of the first electron transport layer ELT1. For example, the absolute value of difference G2 of the LUMO energy level of the emission layer and the LUMO energy level of the first electron transport layer ETL1 may be 0 eV.

An absolute value of difference G3 between the LUMO energy level of the first electron transport layer ETL1 and a LUMO energy level of the second electron transport layer ETL2 may be about 0 eV to about 0.2 eV. The absolute value of difference G2 between the LUMO energy level of the emission layer EML and the LUMO energy level of the first electron transport layer ETL1 and the absolute value of difference G3 between the LUMO energy level of the first electron transport layer ETU and the LUMO energy level of the second electron transport layer ETL2 may be the same or different.

By adjusting the absolute value of difference G3 between the LUMO energy level of the first electron transport layer ETL1 and the LUMO energy level of the second electron transport layer ETL2 to about 0.2 eV or less, electrons may be easily injected, from the second electron transport layer ETL2, into the first electron transport layer ETL1. Accordingly, there may be an enhancement in the effect of minimizing the likelihood that current efficiency may rapidly decline from a low gray level region to a high gray level region.

The thickness of the first electron transport layer ETL1 (TH1 in FIG. 1) may be about 10 Å to about 150 Å. When the thickness of the first electron transport layer ETL1 is less than about 150 Å, the influence of the adjustment of difference between LUMO energy levels of the emission layer EML and the first electron transport layer ETL1 may be greater than the influence of the thickness of the first electron transport layer ETL1 itself on the transport of electrons 200. When the thickness of the first electron transport layer ETL1 is greater than about 10 Å, the electron transport function of the first electron transport layer ETL1 may be sufficient to transport electrons into the emission layer EML.

The thickness of the electron transport layers ETL1, ETL2 including the first electron transport layer ETL1 and the second electron transport layer ETL2 may be about 100 Å to about 1,000 Å, or, for example, about 150 Å to about 500 Å. When the thickness of the electron transport layer falls within the above-described range, a desirable degree of the electron transport property may be achieved without a substantial increase in the driving voltage.

The second electron transport layer ETL2 may be in contact with the first electron transport layer ETL1. The second electron transport layer ETL2, which is directly in contact with the first electron transport layer ETL1, may function to transport electrons provided from the second electrode EL2 into the first electron transport layer ETL1.

The first electron transport layer ETL1 may include a first electron transport material and a first n-type dopant. The weight percent (wt %) of the first n-type dopant based on the first electron transport layer ETL1 may be about 1 wt % to about 90 wt %. The wt % of the first n-type dopant may be based on the total weight of materials included in the first electron transport layer ETL1. The wt % of the first n-type dopant may be, for example, about 10 wt % to about 70 wt %, about 10 wt % to about 60 wt %, about 10 wt % to about 50 wt %, about 15 wt % to about 40 wt %, or about 15 wt % to about 35 wt %, based on the total weight of materials included in the first electron transport layer ETL1. When the wt % of the first n-type dopant included in the first electron transport layer ETL1 falls within the above range, a desirable degree of the electron transport property may be achieved without an excess increase in the driving voltage.

The second electron transport layer ETL2 may include a second electron transport material and a second n-type dopant. The wt % of the second n-type dopant based on the second electron transport layer ETL2 may be about 1 wt % to about 90 wt %. The wt % of the second n-type dopant may be based on the total weight of materials included in the second electron transport layer ETL2. The wt % of the second n-type dopant may be, for example, about 10 wt % to about 70 wt %, about 10 wt % to about 60 wt %, about 10 wt % to about 50 wt %, about 15 wt % to about 40 wt %, or about 15 wt % to about 35 wt %. When the wt % of the second n-type dopant included in the second electron transport layer ETL2 falls within the above range, a desirable degree of the electron transport property may be achieved without an excess increase in the driving voltage.

The first electron transport material and the second electron transport material may respectively include at least one selected from the group of an anthracene derivative, a phosphine oxide derivative, a nitrogen-containing derivative and tris(8-hydroxyquinolinato)aluminum ($Alq_3$). For example, the first electron transport material and the second electron transport material may respectively include at least one selected from the group consisting of an anthracene derivative, a phosphine oxide derivative, a pyridine derivative, a pyrimidine derivative, a triazine derivative and tris (8-hydroxyquinolinato)aluminum ($Alq_3$).

The first n-type dopant and the second n-type dopant may each independently include at least one selected from the group of lithium quinolate (Liq), LiF, $Li_2O$, CsF, BaF, BaO, $Al_2O_3$, NaCl, RbCl, RbI, Ca, Cs and Yb. For example, at least one of the first n-type dopant or second n-type dopant may include Liq.

The first electron transport layer ETL1 and the second electron transport layer ETL2 included in the organic electroluminescent device OEL according to an embodiment may include the same electron transport material. The first electron transport material included in the first electron transport layer ETL1 and the second electron transport material included in the second electron transport layer ETL2 may be same as each other. In this case, the first n-type dopant included in the first electron transport layer ETL1 and the second n-type dopant included in the second electron transport layer ETL2 may be the same as each other, but the wt % of the first n-type dopant in the first electron transport layer ETL1 and the wt % of the second n-type dopant in the second electron transport layer ETL2 may be different from each other. The wt % of the second n-type dopant in the second electron transport layer ETL2 may be lower than the wt % of the first n-type dopant in the first electron transport layer ETL1. For example, the wt % of the second n-type dopant may be about 20 wt % the second electron transport layer ETL2, and the wt % of the first n-type dopant may be about 30 wt % the first electron transport layer ETL1.

The first electron transport layer ETL1 and the second electron transport layer ETL2 include the same electron transport material and the same n-type dopant, and the wt % of the n-type dopant in each layer may be adjusted such that a desirable relationship may be achieved between LUMO energy levels and HOMO energy levels of the emission layer EML, the first electron transport layer ETL1, and the second electron transport layer ETL2.

In some implementations, the first electron transport layer ETL1 and the second electron transport layer ETL2 may include different n-type dopants, such that a desirable relationship may be achieved between LUMO energy levels and HOMO energy levels of the emission layer EML, the first electron transport layer ETL1, and the second electron transport layer ETL2.

For example, the first electron transport material included in the first electron transport layer ETL1 and the second electron transport material included in the second electron transport layer ETL2 may be the same, and the first n-type dopant included in the first electron transport layer ETL1 and the second n-type dopant included in the second electron transport layer ETL2 may be different. In this case, the wt % of the first n-type dopant based on the first electron transport layer ETL1 and the wt % of the second n-type dopant based on the second electron transport layer ETL2 may be the same or may be different depending on specific materials for the first n-type dopant and the second n-type dopant.

Referring back to FIG. 3, the electron transport region ETR may further include an electron injection layer EIL provided between the second electron transport layer ETL2 and the second electrode EL2. The electron injection layer EIL may be provided on the second electron transport layer ETL2. When the electron transport region ETR includes the electron injection layer EIL, the electron transport region ETR may include LiF, lithium quinolate (Liq), $Li_2O$, BaO, NaCl, CsF, a lanthanum metal such as Yb, or a halogenated metal such as RbCl and RbI, as examples. The electron injection layer EIL may also include a material in which an electron transport material and an insulating organo metal salt are mixed. The organo metal salt may be a material having an energy band gap of about 4 eV or more. For example, the organo metal salt may include metal acetate, metal benzoate, metal acetoacetate, metal acetylacetonate or metal stearate. The thickness of the electron injection layer EIL may be about 1 Å to about 100 Å, or about 3 Å to about 90 Å. When the thickness of the electron injection layer EIL falls within the above-described range, a desirable degree of the electron injection property may be achieved without a substantial increase in the driving voltage.

The second electrode EL2 may be provided on the electron transport region ETR. The second electrode EL2 may be a cathode. The second electrode EL2 may be a common electrode. The second electrode EL2 may be a transmissive electrode, a semi-transmissive electrode, or a reflective electrode.

When the second electrode EL2 is a transmissive electrode, the second electrode EL2 may include Li, Ca, LiF/Ca, LiF/Al, Al, Mg, BaF, Ba, Ag, or a compound or mixture thereof (e.g., mixture of Ag and Mg).

The second electrode EL2 may include an auxiliary electrode. The auxiliary electrode may include a film formed to face the emission layer EML. The auxiliary electrode may be formed by depositing any of the foregoing electrode materials, and a transparent metal oxide film on the film, the transparent metal oxide film being made of, for example, indium tin oxide (ITO), indium zinc oxide (IZO), zinc oxide (ZnO), indium tin zinc oxide (ITZO) Mo, or Ti.

When the second electrode EL2 is a semi-transmissive electrode or a reflective electrode, the second electrode EL2 may include Ag, Mg, Al, Pt, Pd, Au, Ni, Nd, Ir, Cr, Li, Ca, LiF/Ca, LiF/Al Mo, Ti or a compound or mixture thereof (e.g., mixture of Ag and Mg). In some implementations, the second electrode EL2 may have a structure of a plurality of layers including a reflective film or a semi-transmissive film formed by using any of the foregoing electrode materials, or a transparent conducting film formed by using indium tin oxide (ITO), indium zinc oxide (IZO), zinc oxide (ZnO), or indium tin zinc oxide (ITZO).

In the case where the organic electroluminescent device OEL is a front emission type, the first electrode EL1 may be a reflective electrode, and the second electrode EL2 may be a transmissive electrode or a semi-transmissive electrode. In the case where the organic electroluminescent device is a bottom emission type, the first electrode EL1 may be a transmissive electrode or a semi-transmissive electrode, and the second electrode EL2 may be a reflective electrode.

An organic capping layer may be provided on the second electrode EL2. The organic capping layer may reflect light emitted from the emission layer EML toward the emission layer EML direction on the top of the organic capping layer. The reflected light may be amplified within the organic layer through a resonance effect, thereby increasing light efficiency. The organic capping layer may prevent loss of light in the second electrode EL2 in the front emission type organic electroluminescent device through total reflection of light.

The organic capping layer may include limitation suitable organic capping material, for example, at least one of N4,N4,N4',N4'-tetra (biphenyl-4-yl) biphenyl-4,4'-diamine (TPD15), 4,4',4"-tris (carbazol sol-9-yl) triphenylamine (TCTA), or N,N'-bis (naphthalen-1-yl), and N,N'-bis (phenyl)-2,2'-dimethylbenzidine (α-NPD).

The organic capping layer may have a refractive index of about 1.6 to about 2.4. When the refractive index of the organic capping layer is less than about 1.6, light emitted from the emission layer EML may be insufficiently reflected toward the emission layer EML direction on the top of the organic capping layer, such that the amount of light that is be amplified within the organic layer through the resonance effect is reduced, and light efficiency of the organic electroluminescent device OEL is deceased. When the refractive index of the organic capping layer is more than about 2.4, light emitted from the emission layer EML may be excessively reflected toward the emission layer EML direction on the top of the organic capping layer, such that the amount of light that penetrates the organic capping layer, and display images, is reduced.

Hereinafter, an organic electroluminescent display according to an embodiment will be described. Hereinafter, different features from the aforementioned organic electroluminescent device OEL according to an embodiment will be mainly described in more detail, and parts that are not described will comply with those described in the organic electroluminescent device OEL according to an embodiment.

Figure 7:
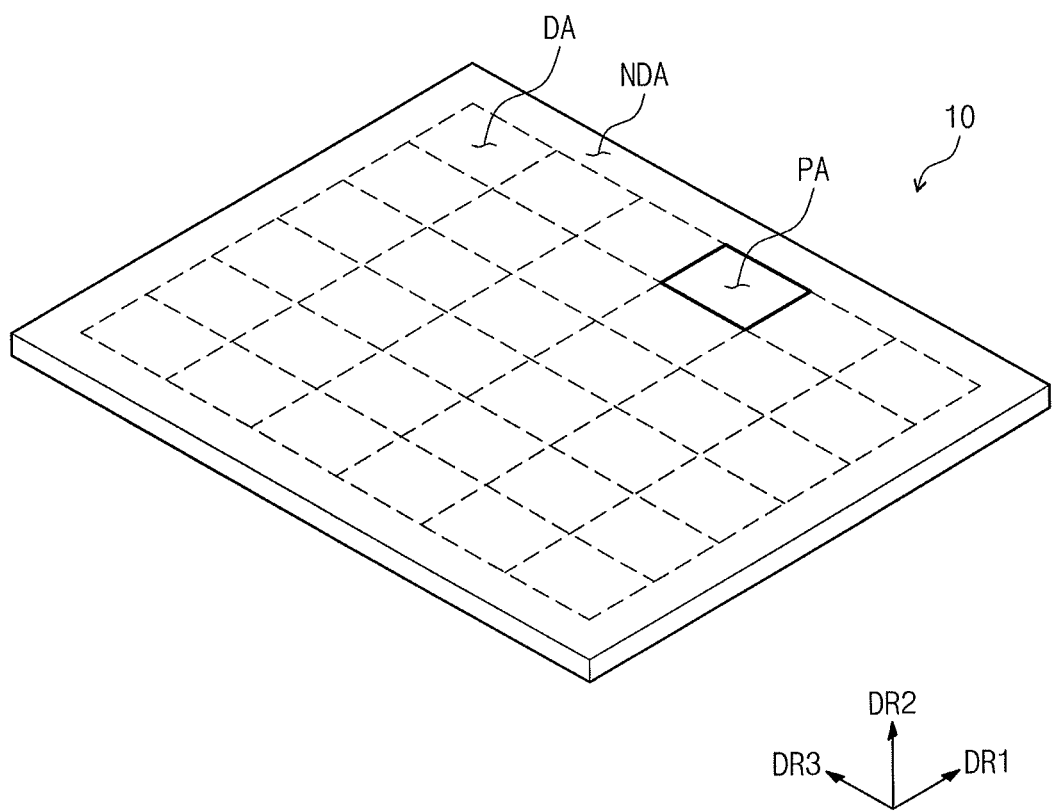
FIG. 7 illustrates a perspective view schematically showing an organic electroluminescent display according to an embodiment.

FIG. 7 illustrates a perspective view schematically showing an organic electroluminescent display according to an embodiment.

Referring to FIG. 7, the organic electroluminescent display 10 according to an embodiment includes a display area DA and a non-display area NDA.

The display area DA is configured to display images. Viewing from the thickness direction of the organic electroluminescent display 10, the display area DA may have an approximately rectangular shape, as an example.

The display area DA may include a plurality of pixel areas PAs. The pixel areas PAs may be disposed in a matrix form. The pixel areas PAs may be defined by a pixel defining layer (PDL in FIG. 10). The pixel areas PAs may respectively include a plurality of pixels (PXs in FIG. 8).

The non-display area NDA may not be configured to display images. Viewing the organic electroluminescent display 10 from the thickness direction, the non-display area NDA may, for example, surround the display area DA. The non-display area NDA may be adjacent to the display area DA in the first direction (e.g., DR1) and the third direction (e.g., DR3), which crosses the first direction (e.g., DR1). The second direction DR2 may be a vertical direction to each of the first direction DR1 and the third direction DR3. The second direction DR2 may be opposite to the thickness direction.

Figure 8:
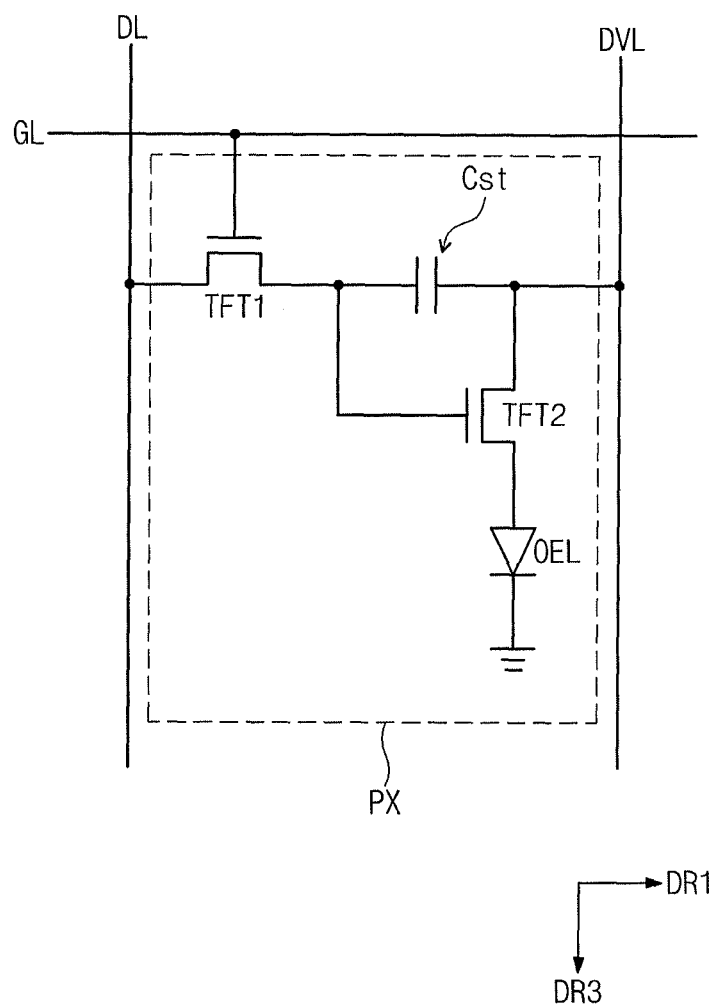
FIG. 8 illustrates a circuit diagram of one of pixels included in the organic electroluminescent display according to an embodiment.

FIG. 8 illustrates a circuit diagram of one of pixels included in the organic electroluminescent display according to an embodiment.

Figure 9:
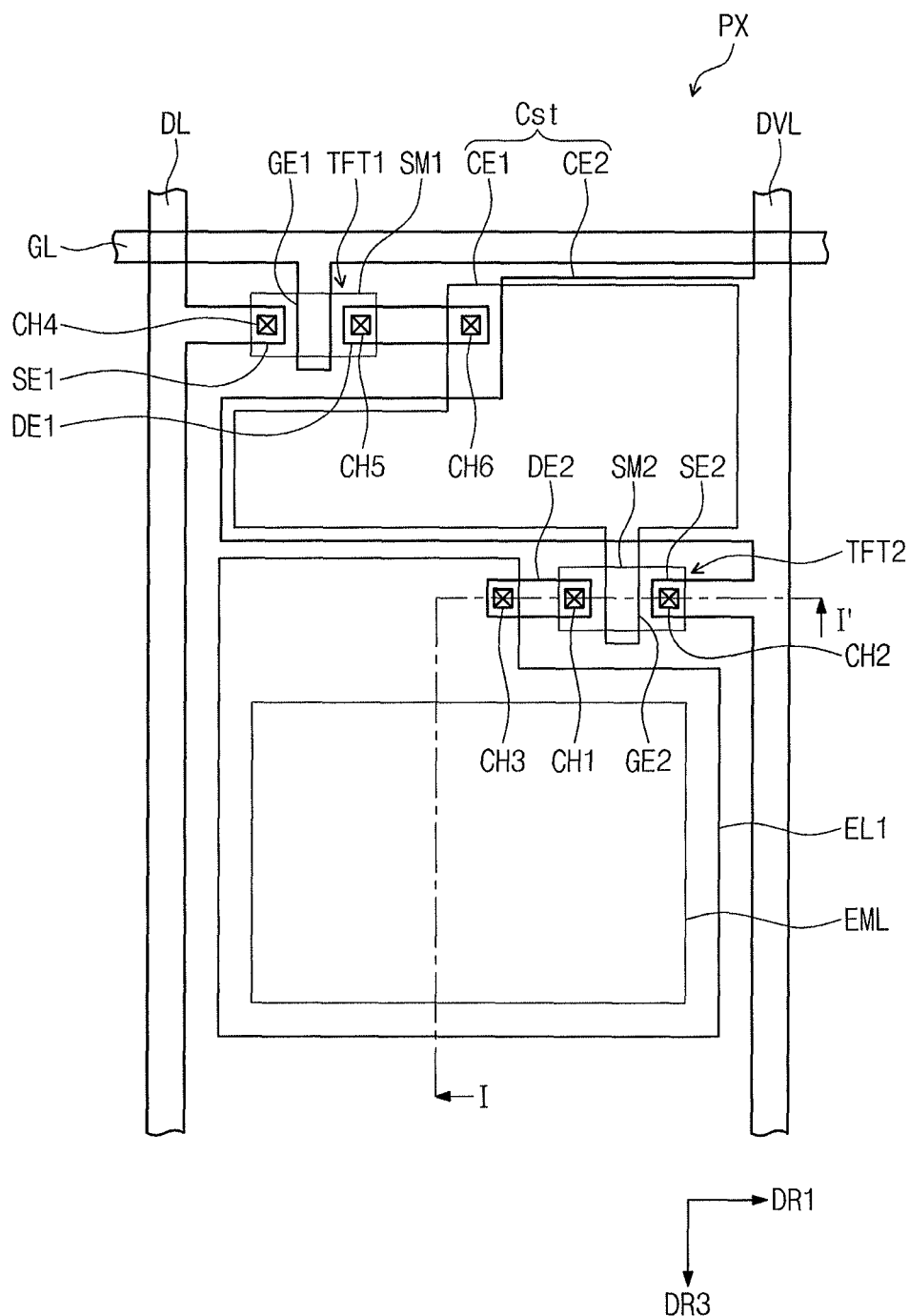
FIG. 9 illustrates a plan view showing one of pixels included in the organic electroluminescent display according to an embodiment.

FIG. 9 illustrates a plan view showing one of pixels included in the organic electroluminescent display according to an embodiment.

Figure 10:
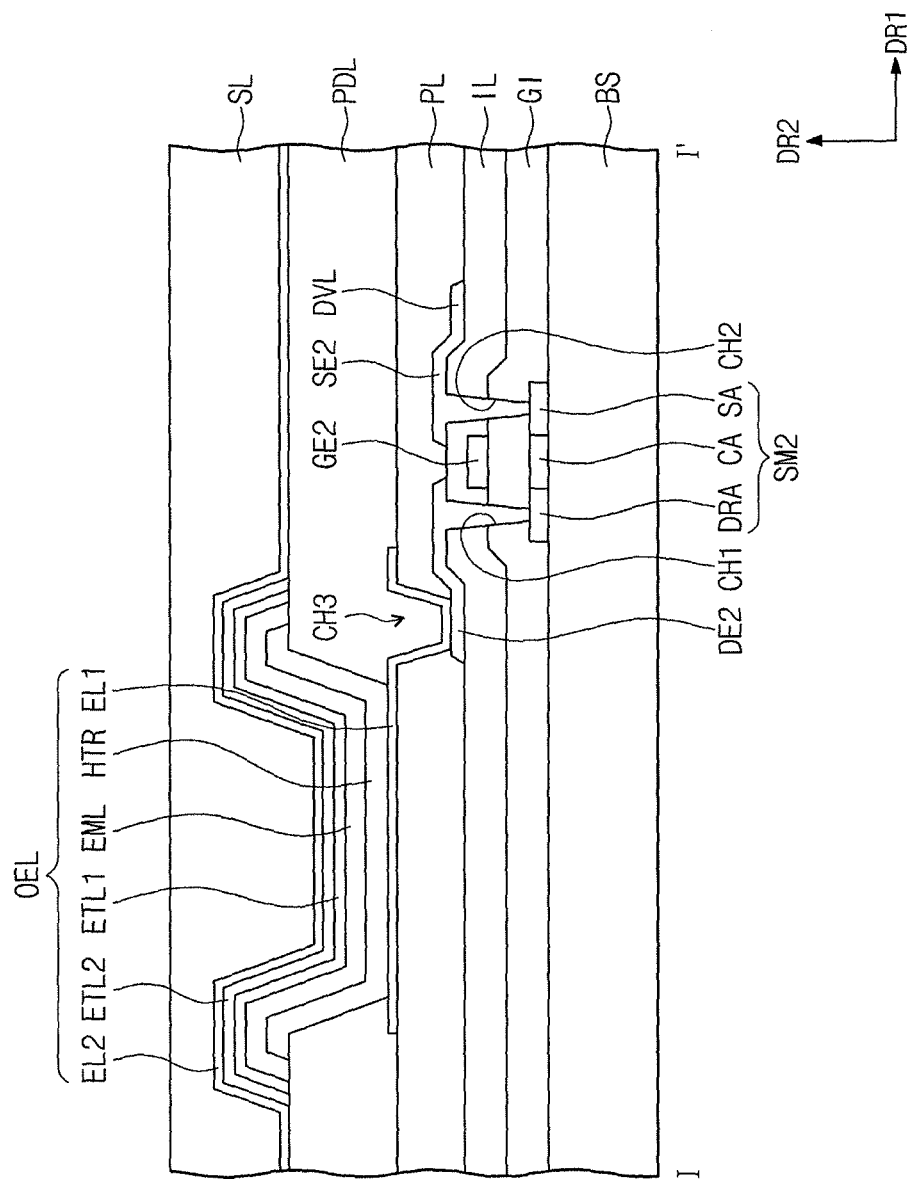
FIG. 10 illustrates a schematic cross sectional view taken along the line I-I' of FIG. 9.

FIG. 10 illustrates a schematic cross sectional view taken along line I-I' in FIG. 9.

Referring to FIGS. 8 to 10, each pixel PX may include a wiring part having a gate line GL, a data line DL, and a driving voltage line DVL, thin-film transistors TFT1, TFT2 coupled to the wiring part, an organic electroluminescent device OEL coupled to the thin-film transistors TFT1, TFT2, and a capacitor Cst.

Each of pixels PXs may emit a particular color of light, for example, one of red light, green light, or blue light. The type of color light is not limited to those described above. For example, pixels PX may emit cyan light, magenta light and or yellow light. Each of pixels PXs may emit white color.

The gate line GL extends in the first direction DR1. The data line DL extends in the third direction DR3, which crosses the gate line GL. The driving voltage line DVL extends in the substantially same direction as the data line DL, i.e., the third direction DR3. The gate line GL transfers a scanning signal to the thin-film transistors TFT1, TFT2, and the data line DL transfers a data signal to the thin-film transistors TFT1, TFT2, while the driving voltage line DVL transfers the driving voltage to the thin-film transistors.

The thin-film transistors TFT1, TFT2 may include a driving thin-film transistor TFT2, which is configured to control the organic electroluminescent device OEL, and a switching thin-film transistor TFT1, which is configured to switch the driving thin-film transistor TFT2. In the embodiment shown in FIGS. 8 and 9, the pixels PXs respectively include both thin-film transistors TFT1, TFT2. In other implementations, the pixels PXs may respectively include one thin-film transistor and a capacitor, or three or more thin-film transistors and two or more capacitors, as examples.

The switching thin-film transistor TFT1 may include a first gate electrode GE1, a first source electrode SE1, and a first drain electrode DE1. The first gate electrode GE1 may be coupled to the gate line GL, and the first source electrode SE1 is coupled may be the data line DL. The first drain electrode DE1 may be coupled to a first common electrode CE1 via a fifth contact hole CH5. The switching thin-film transistor TFT1 may be configured to transfer, to the driving thin-film transistor TFT2, a data signal applied to the data line DL according to a scanning signal applied to the gate line GL.

The driving thin-film transistor TFT2 may include a second gate electrode GE2, a second source electrode SE2, and a second drain electrode DE2. The second gate electrode GE2 may be coupled to the first common electrode CE1. The second source electrode SE2 may be coupled to the driving voltage line DVL. The second drain electrode DE2 may be coupled to the first electrode EL1 via a third contact hole CH3.

The first electrode EL1 may be coupled to a second drain electrode DE2 of the driving thin-film transistor TFT2. A common voltage may be applied to the second electrode EL2, and the emission layer EML may emit particular color of light according to an output signal of the driving thin-film transistor TFT2, thereby displaying images.

The capacitor Cst may be coupled between a second source electrode SE2 and a second gate electrode GE2 of the driving thin-film transistor TFT2. The capacitor Cst may be configured to charge and maintain a data signal inputted to the second gate electrode GE2 of the driving thin-film transistor TFT2. The capacitor Cst may include a first common electrode CE1, which is coupled to the first drain electrode DE1 via a sixth contact hole CH6, and a second common electrode CE2, which is coupled to the driving voltage line DVL.

Referring to FIGS. 9 and 10, the organic electroluminescent display 10 according to an embodiment may include a base substrate BS onto which the thin-film transistor and the organic electroluminescent device OEL are laminated. The base substrate BS may be formed by using limitation suitable base substrate material, for example, an insulating material such as glass, plastic, and crystal. Examples of organic polymers included in the base substrate BS may include polyethylene terephthalate (PET), polyethylene naphthalate (PEN), polyimide, and polyethersulfone, etc. The base substrate BS may be selected in consideration of mechanical strength, thermal stability, transparency, surface smoothness, tractability, and water repellency, etc.

A substrate buffer layer may be provided on the base substrate BS. The substrate buffer layer may prevent diffusion of impurities into the switching thin-film transistor TFT1 and the driving thin-film transistor TFT2. The substrate buffer layer may be formed by using silicon nitride (SiNx), silicon oxide (SiOx), or silicon oxynitride (SiOxNy), etc. Depending on process conditions and materials of the base substrate BS, the buffer layer may be omitted.

A first semiconductor layer SM1 and a second semiconductor layer SM2 may be provided on the base substrate BS. The first semiconductor layer SM1 and the second semiconductor layer SM2 may be formed by using a semiconductor material The first semiconductor layer SM1 and the second semiconductor layer SM2 may be respectively operated as an active layer of the switching thin-film transistor TFT1 or of the driving thin-film transistor TFT2. The first semiconductor layer SM1 and the second semiconductor layer SM2 may respectively include a source area SA, a drain area DRA, and a channel area CA provided between the source area SA, and the drain area DRA. The first semiconductor layer SM1 and the second semiconductor layer SM2 may be formed selected material selected from an organic semiconductor or an inorganic semiconductor. The source area SA and the drain area DRA may be doped with an n-type impurity or a p-type impurity.

A gate insulating layer G1 may be provided on the first semiconductor layer SM1 and the second semiconductor layer SM2. The gate insulating layer G1 may cover the first semiconductor layer SM1 and the second semiconductor layer SM2. The gate insulating layer G1 may be formed by using an organic insulating material or an inorganic insulating material.

A first gate electrode GE1 and a second electrode GE2 may be provided on the gate insulating layer G1. The first gate electrode GE1 and the second electrode GE2 may be configured to cover areas corresponding to the respective channel areas CAs of the first semiconductor layer SM1 and the second semiconductor layer.

An interlayer insulating layer IL may be provided on the first gate electrode GE1 and the second electrode GE2. The interlayer insulating layer IL may cover the first gate electrode GE1 and the second electrode GE2. The interlayer insulating layer IL may be made of an organic insulating material or an inorganic insulating material.

The first source electrode SE1, the first drain electrode DE1, the second source electrode SE2 and the second drain electrode DE2 may be provided on the interlayer insulating layer IL. The second drain electrode DE2 may contact a drain area DRA of the second semiconductor layer SM2 via a first contact hole CH1 provided in the gate insulating layer G1 and the interlayer insulating layer IL. The second source electrode SE2 may contact the source area SA of the second semiconductor layer SM2 via a second contact hole CH2 provided in the gate insulating layer G1 and the interlayer insulating layer IL. The first source electrode SE1 may contact a source area of the first semiconductor layer SM1 via a fourth contact hole CH4 provided in the gate insulating layer G1 and the interlayer insulating layer IL. The first drain electrode DE1 may contact a drain area of the first semiconductor layer SM1 via a fifth contact hole CH5 provided in the gate insulating layer G1 and the interlayer insulating layer IL.

A passivation layer PL may be provided on the first source electrode SE1, the first drain electrode DE1, the second source electrode SE2, and the second drain electrode DE2. The passivation layer PL may function as a protecting layer to help protect the switching thin-film transistor TFT1 and the driving thin-film transistor TFT2, or a may function as a smoothness layer to smoothen the top surface thereof.

The first electrode EL1 may be provided on the passivation layer PL. A pixel defining layer PDL may be provided on the passivation layer PL. The pixel defining layer may be configured to define pixel areas (PAs in FIG. 7) to correspond to each pixel (PX). The pixel defining layer PDL may protrude from the base substrate BS along perimeters of each pixel PX while exposing the top surface of the first electrode EL1.

The organic electroluminescent device OEL may be provided in each pixel area (PA in FIG. 7) surrounded by the pixel defining layer PDL. The organic electroluminescent device OEL may include a first electrode EL1, a hole transport region HTR, an emission layer EML, an electron transport region ETR, and a second electrode EL2.

Pixel areas (PAs in FIG. 7) and non-pixel areas may be defined by the pixel defining layer PDL. The hole transport region HTR, the electron transport region ETR and the second electrode EL2 may be commonly provided to both pixel areas (PAs in FIG. 7) and non-pixel area. The first electrode EL1 and the emission layer EML may be subjected to patterning. In some implementations, the first electrode EL1 and the emission layer EML may be provided only to the pixel areas (PAs in FIG. 7).

The organic electroluminescent display 10 according to an embodiment may include a plurality of pixels PXs, wherein each of pixels PXs includes the organic electroluminescent device OEL. Each of pixels PXs may include the first electrode EL1, the hole transport region HTR provided on the first electrode, the emission layer provided on the hole transport region HTR, the electron transport region ETR provided on the emission layer EML, and the second electrode provided on the electron transport region ETR. The electron transport region ETR may include a first electron transport layer ETL1 provided on the emission layer EML, and a second electron transport layer ETL2 provided on the first electron transport layer ETL1.

The first electrode EL1, the hole transport region HTR, the emission layer EML, the electron transport region ETR, and the second electrode EL2 may be sequentially laminated on the base substrate BS in a certain direction. The first electrode EL1, the hole transport region HTR, the emission layer EML, the electron transport region ETR, and the second electrode EL2 may be sequentially laminated on the base substrate BS in the second direction DR2.

A detailed description of each of the first electrode EL1, the hole transport region HTR, the emission layer EML, the electron transport region ETR including the first electron transport layer ETL1 and the second electron transport layer ETL2, and the second electrode EL2 is provided above.

As described above, the absolute value of the difference G1 between the HOMO energy level of the emission layer EML and the HOMO energy level of the first electron transport layer ETL1 may be about 0.3 eV to about 1.5 eV.

As described above, the absolute value of the difference G2 between the LUMO energy level of the emission layer EML and the LUMO energy level of the first electron transport layer ETL1 may be about 0 eV to about 0.2 eV. The absolute value of the difference G3 between the LUMO energy level of the first electron transport layer ETL1 and the LUMO energy level of the second electron transport layer ETL2 may be about 0 eV to about 0.2 eV.

In some implementations, to achieve the relationship between the energy level differences as described above, the first electron transport layer ETL1 may include a first electron transport material and a first n-type dopant and the second electron transport layer ETL2 may include a second electron transport material and a second n-type dopant. The first electron transport material may be the same as the second electron transport material, the first n-type dopant may be the same as the second n-type dopant, and the wt % of the second n-type dopant based on the second electron transport layer ETL2 may be lower than the wt % of the first n-type dopant based on the first electron transport layer ETL1.

In some implementations, the first electron transport layer ETL1 may include a first electron transport material and a first n-type dopant and the second electron transport layer ETL2 may include a second electron transport material and a second n-type dopant, wherein the first electron transport material may be the same as the second electron transport material, and the first-n-type dopant may differ from the second n-type dopant.

By way of summation and review, in an OLED, holes and electrons injected from first and second electrodes may recombine and emit light in emission layers. The injected holes and electrons combine to form excitons which drop from the excited state to the ground state, thereby emitting light of various colors.

The organic electroluminescent device and the organic electroluminescent display including the same according to an embodiment may minimize the transport of holes into the electron transport region and may thereby inhibit oxidation of the electron transport region due to accumulation of holes. Thus, the organic electroluminescent device and the organic electroluminescent display including the same according to an embodiment may respectively achieve long life.

The organic electroluminescent device and the organic electroluminescent display including the same according to an embodiment may facilitate the injection of electrons from the electron transport layer into the emission layer to thereby minimize changes in efficiency at each gray level.

In each of the organic electroluminescent device and the organic electroluminescent display according to embodiments, hole transport into the electron transport layer of holes that do not participate in emission within the emission layer may be minimized, thereby implementing life enhancement.

In each of the organic electroluminescent device and the organic electroluminescent display according to an embodiment, changes in efficiency at each gray level may be minimized by facilitating the injection of electrons into the emission layer.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. An organic electroluminescent device, comprising:
a first electrode;
a hole transport region on the first electrode;
an emission layer on the hole transport region;
an electron transport region on the emission layer; and
a second electrode on the electron transport region,
wherein:
the electron transport region includes a first electron transport layer on the emission layer, and a second electron transport layer on the first electron transport layer,
an absolute value of difference between a highest occupied molecular orbital (HOMO) energy level of the emission layer and a HOMO energy level of the first electron transport layer is about 0.3 eV to about 1.5 eV,
the first electron transport layer includes a first electron transport material and a first n-type dopant, and
the second electron transport layer includes a second electron transport material and a second n-type dopant.

2. The organic electroluminescent device as claimed in claim 1, wherein an absolute value of difference between a lowest unoccupied molecular orbital (LUMO) energy level of the emission layer and a LUMO energy level of the first electron transport layer is about 0 eV to about 0.2 eV.

3. The organic electroluminescent device as claimed in claim 1, wherein an absolute value of difference between the LUMO energy level of the first electron transport layer and a LUMO energy level of the second electron transport layer is about 0 eV to about 0.2 eV.

4. The organic electroluminescent device as claimed in claim 1, wherein the absolute value of difference between the HOMO energy level of the emission layer and the HOMO energy level of the first electron transport layer is about 0.5 eV to about 1.5 eV.

5. The organic electroluminescent device as claimed in claim 1, wherein:
the first electron transport layer contacts the emission layer, and
the second electron transport layer contacts the first electron transport layer.

6. The organic electroluminescent device as claimed in claim 1, wherein the first electron transport material and the second electron transport material are the same as each other.

7. The organic electroluminescent device as claimed in claim 6, wherein:
the first n-type dopant and the second n-type dopant are the same as each other, and
a weight percent (wt %) of the first n-type dopant based on a total weight of the first electron transport layer and a weight percent (wt %) of second n-type dopant based on a total weight of the second electron transport layer are different from each other.

8. The organic electroluminescent device as claimed in claim 7, wherein the wt % of the second n-type dopant based on the total weight of the second electron transport layer is less than the wt % of the first n-type dopant based on the a total weight of the first electron transport layer.

9. The organic electroluminescent device as claimed in claim 6, wherein the first n-type dopant and the second n-type dopant are different from each other.

10. The organic electroluminescent device as claimed in claim 1, wherein the first electron transport material and the second electron transport material each include at least one selected from the group of an anthracene derivative, a phosphine oxide derivative, a nitrogen-containing aromatic compound, and tris(8-hydroxyquinolinato)aluminum ($Alq_3$).

11. The organic electroluminescent device as claimed in claim 1, wherein the first n-type dopant and the second n-type dopant each independently include at least one selected from the group of lithium quinolate (Liq), LiF, $Li_2O$, CsF, BaF, BaO, $Al_2O_3$, NaCl, RbCl, RbI, Ca, Cs and Yb.

12. The organic electroluminescent device as claimed in claim 1, wherein the emission layer includes an anthracene derivative represented by following Formula 1:

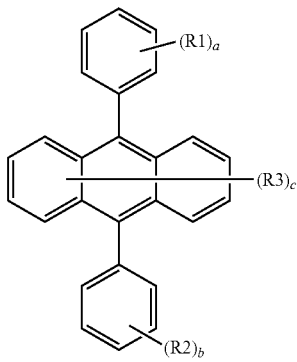

[Formula 1]

wherein, in Formula 1,

R1 to R3 are each independently hydrogen, deuterium, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms;

a and b are each independently an integer from 0 to 5;

c is an integer from 0 to 8; and a plurality of adjacent R1 to R3 are separate or combine with one another to form a saturated or unsaturated ring.

13. The organic electroluminescent device as claimed in claim 12, wherein:

a is 2, and two adjacent R1 s combine with each other and form a benzene ring fused with the benzene ring to which the two adjacent R1 s are attached.

14. The organic electroluminescent device as claimed in claim 1, wherein the thickness of the first electron transport layer is about 10 Å to about 150 Å.

15. The organic electroluminescent device as claimed in claim 1, wherein the hole transport region includes:

a hole injection layer on the first electrode; and a hole transport layer on the hole injection layer, and the electron transport region further includes an electron injection layer between the second electron transport layer and the second electrode.

16. An organic electroluminescent display, comprising:

a plurality of pixels, which respectively include:

a first electrode;

a hole transport region on the first electrode;

an emission layer on the hole transport region;

an electron transport region on the emission layer; and a second electrode on the electron transport region, wherein the electron transport region includes:

a first electron transport layer on the emission layer, and a second electron transport layer on the first electron transport layer, wherein:

an absolute value of a difference between a highest occupied molecular orbital (HOMO) energy level of the emission layer and a HOMO energy level of the first electron transport layer is about 0.3 eV to about 1.5 eV, the first electron transport layer includes a first electron transport material and a first n-type dopant, and the second electron transport layer includes a second electron transport material and a second n-type dopant.

17. The organic electroluminescent display as claimed in claim 16, wherein:

an absolute value of a difference between a lowest unoccupied molecular orbital (LUMO) energy level of the emission layer and a LUMO energy level of the first electron transport layer is about 0 eV to about 0.2 eV, and an absolute value of a difference between the LUMO energy level of the first electron transport layer and a LUMO energy level of the second electron transport layer is about 0 eV to about 0.2 eV.

18. The organic electroluminescent display as claimed in claim 16, wherein:

the first electron transport material and the second electron transport material are the same as each other;

the first n-type dopant and the second n-type dopant are the same as each other; and the weight percent (wt %) of the second n-type dopant based on a total weight of the second electron transport layer is lower than the weight percent (wt %) of the first n-type dopant based on a total weight of the first electron transport layer.

19. The organic electroluminescent display as claimed in claim 16, wherein:

the first electron transport material and the second electron transport material are the same as each other; and the first n-type dopant and the second n-type dopant are different from each other.

* * * * *